US006653796B2

(12) United States Patent
Kimura

(10) Patent No.: US 6,653,796 B2
(45) Date of Patent: Nov. 25, 2003

(54) LIGHT-EMITTING DEVICE AND EXPOSURE DEVICE AND FLAT DISPLAY DEVICE USING THE SAME

(75) Inventor: Koichi Kimura, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 113 days.

(21) Appl. No.: 09/910,729

(22) Filed: Jul. 24, 2001

(65) Prior Publication Data

US 2002/0043927 A1 Apr. 18, 2002

(30) Foreign Application Priority Data

Jul. 24, 2000 (JP) ...................... P. 2000-222604

(51) Int. Cl.⁷ .............. G09G 3/10; H01J 1/62
(52) U.S. Cl. ................... 315/169.3; 313/504
(58) Field of Search ............ 315/169.1, 169.3; 313/498, 501, 502, 503, 504, 506, 507

(56) References Cited

U.S. PATENT DOCUMENTS 5,281,489 A * 1/1994 Mori et al. .............. 428/690
5,338,690 A * 8/1994 Fukaya et al. .............. 438/59
6,191,764 B1 * 2/2001 Kono et al. ................. 345/76
6,485,849 B2 * 11/2002 Petticrew .................. 428/697

FOREIGN PATENT DOCUMENTS

| JP | 8-234683 | 9/1996 | ............ G09F/9/30 |
| JP | 9-185332 | 7/1997 | ............ G09F/9/30 |
| JP | 10-171375 | 6/1998 | ............ G09F/9/30 |

* cited by examiner

Primary Examiner—Don Wong
Assistant Examiner—Minh Din A
(74) Attorney, Agent, or Firm—Sughrue Mion, PLLC

(57) ABSTRACT

A light-emitting device comprising a display light-emitting part 43 made of a laminate of a first electrode 47, an organic EL layer 49, a photoconductive layer 51 and a second electrode 53 in sequence; and an external light-emitting part 45 laminated on the second electrode 53 side of the display light-emitting part 43, the photoconductive layer 51 receiving light emitted from the external light-emitting part 45, the photoconductive layer 51 being made of a photoconductor having a current amplification mechanism for multiplying carriers generated in a photoelectric conversion process. For example, a photoconductor having a current amplification mechanism using an avalanche effect can be preferably adapted to the photoconductive layer 51.

26 Claims, 8 Drawing Sheets

LIGHT-EMITTING DEVICE AND EXPOSURE DEVICE AND FLAT DISPLAY DEVICE USING THE SAME

BACKGROUND OF THE INVENTION

1. Field of the Invention

The present invention relates to a light-emitting device having a laminate of an organic EL layer and a photoconductive layer, and relates to an exposure device and a display device using the light-emitting device.

2. Description of the Related Art

Heretofore, Braun tubes (cathode-ray tubes) have been used in a large-size information display device exclusively. When information era comes and particularly, portability is regarded as important, flat-plate-like display devices which are thin in thickness and light in weight and which is low in operating voltage are in demand. A liquid-crystal display device is one of such flat-plate-like display devices. However, because of a back-lighting system required, the liquid-crystal display device is increased correspondingly in consumed electric power and has a limitation in reduction of thickness.

An organic EL (electroluminescent) device is a flat display device which can operate with a low voltage and which can be made thin because of no back-lighting system required. For example, a display device having a simple matrix structure shown in FIG. 8 has been put to practical use as a display device including an organic EL device 1. In the simple matrix structure, a number, X, of pixels connected to row electrodes 3 and arranged laterally in one row are selected so as to operate simultaneously. An on-off state of each pixel is set in accordance with a display information signal by switching devices connected to a number, Y, of column electrodes 5 respectively. When adjacent ones of the row electrodes 3 are selected sequentially so as to go through the whole display screen once, one scene is displayed.

For example, in an NTSC system, however, the scene is rewritten and displayed at the rate of 30 scenes per second or more (N scene/sec) in order to obtain a flickerless screen with an animation image displayed by the aforementioned scanning method. Hence, the period of time that the selected pixels are in an operating state is only 1/(N·Y) sec. For example, in the case of N=30 and Y=300, the period of time is 1/9000 sec. In this case, voltage application for a plurality of cycles cannot be performed in one selection period if the frequency of a driving electric source is not higher than tens of kHz. A pulse voltage driving method in which a pulse voltage is given in synchronism with the selection period is, however, used generally as a practical method for driving respective pixels on one and the same condition. Hence, this is equivalent to the fact that the display device is driven by the frequency N, so that no higher luminance but luminance corresponding to the frequency can be expected.

In order to satisfy the necessary luminance (=average luminance×the number of scanning lines), a large peak current flows in the row electrodes 3, the column electrodes 5 and the organic EL devices 1. As a result, a voltage drop caused by the large peak current makes the image uneven. Moreover, because the luminance required of each organic EL device 1 increases, a burden for retrieving materials is needed and the life and stability is reduced. These disadvantages become more remarkable as the definition and screen of the display device become higher and larger respectively.

To eliminate the aforementioned disadvantages, therefore, a display panel having TFT such as a-Si or p-Si provided for each pixel has been described in JP-A-8-234683. In the display panel shown in FIG. 9, when a scanning signal is supplied to a selected row electrode 3, a first TFT 7 is turned on so that a capacitor 9 is charged with the image signal voltage applied to the column electrode 5. This signal voltage becomes a gate-source voltage of a second TFT 11. Hence, a constant current corresponding to the gate-source voltage flows in the organic EL device 1 connected to the drain of the second TFT 11, and goes from a first common electrode 13 toward a second common electrode 15. As a result, the organic EL device 1 emits light with luminance approximately proportional to the current value.

Even in the case where the first TFT 7 is now turned off in order to select another row, the luminance of light emission is kept constant until all scans are terminated and the selection scanning of the row can be performed again because the image signal voltage is stored in the capacitors 9 (memory characteristic attained by the first TFT and the capacitors). Such memory characteristic attained by the TFT can be provided to thereby solve the problem of low luminance or the like in simple matrix driving.

As another display device provided to eliminate the aforementioned disadvantages, a display device attaining the memory characteristic without use of any TFT has been described in JP-A-9-185332. The display device shown in FIG. 10 generally comprises an EL display device 1 for display light emission, and an address light device 17 for scanning and signal writing, disposed on the back of the EL display device 1. The EL display device 1 includes, when viewed from the back, an electrode 19, a photoconductive layer 21, a light-emitting layer 23, and an electrode 25 in sequence. The address light device 17 for scanning and signal writing is formed as a simple matrix structure.

When a voltage is applied between row electrodes 3 selected by linearly sequential scanning and column electrodes 5 in the address light device 17, the light-emitting layer 27 is irradiated with ultraviolet light as signal light toward the photoconductive layer 21. A portion of the photoconductive layer 21, on which the signal light is incident, forms an electric conductor by absorbing the light. Hence, the portion of the photoconductor layer 21 is electrically connected to the rear driving electrode 19. Hence, the electric potential applied between the front driving electrode 25 and the rear driving electrode 19 is applied to a predetermined dot portion of the light-emitting layer 23.

As a result, forward light is emitted and, at the same time, backward light, that is, feedback light is emitted because of light emission of the EL display device 1. The feedback light enters the photoconductive layer 21, so that the photoconductive layer 21 is excited again to thereby generate new electron-hole pairs. Hence, the photoconductive layer 21 is kept in an electric conduction state, so that the driving voltage is continuously applied to a corresponding portion of the EL display device 1. Because the display light-emitting layer is always driven during this state, the display light-emitting layer is kept in a light emission state even in the case where the column and row electrodes 5 and 3 in the address light device 17 are not in a selected state. Hence, light emission is continued by linearly sequential scanning until the second scanning cycle.

Hence, memory characteristic can be achieved by feedback light in each pixel in a simple structure without use of active driving represented by TFT, so that high-quality display can be performed under a high-duty-cycle driving condition.

As a further display device provided to eliminate the aforementioned disadvantages, a display device attaining memory characteristic by optical switches of bipolar transistors has been disclosed in JP-A-10-171375. The display device shown in FIG. 11 comprises a glass substrate 31, an npn-structure bipolar transistor portion 33 formed on the glass substrate 31, and an organic EL device 1 formed on the bipolar transistor portion 33. A rear electrode 35 is formed on the back surface of the bipolar transistor portion 33. A rear electrode 35 and a front electrode 37 forming an XY matrix are formed on the front surface of the organic EL device 1. Hence, when a predetermined voltage is applied between the front and rear electrodes, the organic EL device 1 emits light to thereby generate display light and, at the same time, the bipolar transistor portion 33 is excited optically so that memory characteristic can be given to the light emission.

Hence, also in this display device, memory characteristic can be achieved by feedback light in each pixel in a simple structure without use of any TFT or the like. Hence, high-quality display can be performed under a high-duty-cycle driving condition.

The display panel having TFT provided for each pixel as shown in FIG. 9, however, has a problem that the production cost is high because the number of production steps increases for the formation of TFTs. In addition, it is difficult to form TFTs adapted to a large-screen display device for TV having a size exceeding 30 inches.

In the display device having memory characteristic attained by positive feedback of light without use of any TFT as shown in FIG. 10, if a general photoconductor and an organic EL layer are laminated on each other as a structure of the address light device for scanning and signal writing and the EL display device for display light emission, it is necessary to generate at least one electron or hole from the photoconductive layer when the quantum efficiency of the display light emission EL layer is not larger than 1, so that the display light emission EL device can emit one photon. In other words, when the photoelectronic quantum efficiency of the photoconductive layer is not larger than 1, the number of light emission photons required for the address light device to perform scanning and signal writing is not smaller than 1. Generally, the aforementioned quantum efficiency is not larger than 1, and if the wavelength of light absorbed to the photoconductive layer is shorter than that of display light, display light emission suffers an energy loss out of the light absorbed to the photoconductive layer.

Hence, it is conceived that it is difficult to keep the display light emission state the same as that at the write time even in the case where light emission of the address light device for scanning and signal writing is stopped and light emitted from the EL display device for display light emission is absorbed to the photoconductive layer. Moreover, also at the scanning/writing time of the address light device for scanning and signal writing, the address light device for scanning and signal writing is required to emit light with sufficient energy for the aforementioned reason. Hence, the address light device for scanning and signal writing in a simple matrix structure has still the aforementioned problem (peak current). In addition, memory characteristic attained by positive feedback of light is low in stability and there is a problem that it is difficult to obtain halftone characteristic.

The display device having memory characteristic attained by optical switches of bipolar transistors as shown in FIG. 11 is a device in which light emitted backward from the organic EL layer (feedback light) is absorbed to a base of a bipolar transistor to thereby perform current conduction of the bipolar transistor on the basis of the photocurrent thereof to thereby feedback the current flowing in the organic EL layer to thereby give memory characteristic. Similar to the case of TFTs, the number of production steps for forming bipolar transistors increases and the production cost is high. There is a problem that it is difficult to form a large-screen display device. In addition, it is difficult to put the organic EL device into practical use because n-type semiconductor is unstable in air.

SUMMARY OF THE INVENTION

The present invention is designed upon such circumstances and an object thereof is to provide a light-emitting device in which: the burden imposed on the light-emitting device can be lightened by use of a simple matrix structure; stable light emission with memory characteristic can be made as in the case where TFT is used; and high definition and large display screen can be achieved inexpensively; and to provide an exposure device and a display device using the light-emitting device.

In order to achieve the above object, according to an aspect of the present invention, there is provided a light-emitting device comprising: a display light-emitting part made of a laminate of a first electrode, an organic EL layer, a photoconductive layer and a second electrode in sequence; and an external light-emitting part laminated on the second electrode side of the display light-emitting part, the photoconductive layer of the display light-emitting part receiving light emitted from the external light-emitting part, the photoconductive layer being made of a photoconductor having a current amplification mechanism so that carriers generated in a photoelectric conversion process are multiplied by the current amplification mechanism.

In the light-emitting device, when the external light-emitting part emits light, the light enters the photoconductive layer of the display light-emitting part. Hence, carriers are generated in the light-incidence region of the photoconductive layer, so that light emits from a region of the display light-emitting part corresponding to the region of the photoconductive layer in which the carriers are generated. On this occasion, the carriers generated in a photoelectric conversion process are multiplied by the current amplification mechanism. Hence, the carrier generating efficiency exceeds 1, so that high luminance is obtained.

According to another aspect of the present invention there is provided a light-emitting device comprising: a display light-emitting part made of a laminate of a first electrode, an organic EL layer, a photoconductive layer and a second electrode in sequence; and an external light-emitting part laminated on the second electrode side of the display light-emitting part, the photoconductive layer of the display light-emitting part receiving light emitted from the external light-emitting part, the photoconductive layer being made of a photoconductor having a current amplification mechanism so that carriers generated in a photoelectric conversion process are multiplied by the current amplification mechanism and continuously generated by light emitted from the organic EL layer.

In the light-emitting device, light is emitted from the display light-emitting part to the outside and to the photoconductive layer. The feedback emitted light is absorbed to the photoconductive layer again, so that a great deal of carriers are generated by the aforementioned multiplication function. Hence, even in the case where incident light from the external light-emitting part is turned off, carriers are continuously generated due to the feedback light effect. There is therefore provided memory characteristic that light is continuously emitted from the display light-emitting part until the voltage is turned off.

In the light-emitting device in this invention, the photoconductor has a current amplification mechanism attained by an avalanche effect.

In the light-emitting device, when a high intensity of electric field is applied to the photoconductor, a carrier collides with a grating atom to ionize bound electrons to thereby generate free electrons and holes as the secondary carriers. These secondary carriers take part in collision ionization sequentially, so that multiplication of carriers occurs acceleratively. Hence, rapid multiplication of current occurs in the photoconductor.

In the light-emitting device in this invention, the photoconductor is one member selected from the group consisting of c-Si, a-Se and a-SiC.

In the light-emitting device, any one of c-Si, a-Se and a-SiC is used as the material of the photoconductor so that an avalanche effect can be generated in the photoconductive layer.

In the light-emitting device in this invention, the photoconductor has a current amplification mechanism by which carriers (electrons or holes) are injected from the second electrode into the photoconductive layer on the basis of carriers (holes or electrons) generated in the photoconductive layer by light absorption.

In the light-emitting device, when holes are generated in the photoconductive layer by light absorption, electrons are injected from the second electrode into the photoconductive layer by the current amplification mechanism of the photoconductor. Further, when electrons are generated in the photoconductive layer by light absorption, holes are injected from the second electrode into the photoconductive layer.

In the light-emitting device in this invention, injection of the carriers exhibits a tunnel current in an interface between the photoconductive layer and the second electrode.

In the light-emitting device, carriers not having sufficient energy to skip over the potential barrier can pass through the barrier on the basis of the wave function of carriers taking a large value on the opposite side to the barrier because the potential barrier is thin. Hence, a current flows in the interface between the photoconductive layer and the second electrode.

In the light-emitting device in this invention, each of the carriers to be injected is an electron.

In the light-emitting device, holes are generated in the photoconductive layer by light absorption, so that electrons are injected from the second electrode into the photoconductive layer.

In the light-emitting device in this invention, the photoconductive layer is made of an organic photoconductor.

In the light-emitting device, the current multiplication phenomenon is obtained by the photoconductive layer made of an organic thin film even without the avalanche effect obtained by inorganic silicon semiconductor or the like.

In the light-emitting device in this invention, the organic photoconductor is one member selected from the group consisting of a perylene pigment, a quinacridone pigment, and a naphthalenetetracarboxylic derivative.

In the light-emitting device, a perylene pigment, a quinacridone pigment, a naphthalenetetracarboxylic derivative, or the like, can be used to form the photoconductive layer of an organic thin film so that the current multiplication phenomenon can be obtained.

In the light-emitting device in this invention, the second electrode is an Au electrode.

In the light-emitting device, an Au electrode is used. Particularly when the Au electrode serves as a cathode, carriers (electrons) can be injected easily from the Au electrode to thereby improve the current multiplication effect.

In the light-emitting device in this invention, injection of the carriers is based on skipping over an electric potential barrier.

In the light-emitting device, carriers generated by light irradiation are trapped in the interface between the second electrode and the photoconductive layer. Hence, the barrier to injection of carriers is lowered to promote injection of carriers from the second electrode and increase the photocurrent.

In the light-emitting device in this invention, each of the carriers to be injected is a hole.

In the light-emitting device, carriers are generated in the irradiation portion of the photoconductive layer. Similarly, holes move to the first electrode side and electrons are trapped in the interface between the photoconductive layer and the second electrode. Hence, in the irradiation portion of the photoconductive layer, the electron density of the interface between the photoconductive layer and the second electrode increases in comparison with that in the non-irradiation portion. Hence, in the irradiation portion, injection of holes from the second electrode side increases, so that the photocurrent is amplified by the injection of holes.

In the light-emitting device in this invention, the photoconductive layer is made of an organic photoconductor.

In the light-emitting device, the current multiplication phenomenon is obtained by the photoconductive layer made of an organic thin film even without the avalanche effect obtained by inorganic silicon semiconductor or the like.

In the light-emitting device in this invention, the organic photoconductor is a bis-azo pigment.

In the light-emitting device, a bis-azo pigment can be used to form the photoconductive layer so that the current multiplication phenomenon owing to skipping over the potential barrier can be obtained.

In the light-emitting device in this invention, the second electrode is made of an ITO film.

In the light-emitting device, the second electrode is formed from an ITO film. The ITO film is an electric conductor in which transparency can be controlled freely in a range of from near-ultraviolet light to visible light and near-infrared light. Particularly when the electrode serves as an anode, carriers (holes) can be injected easily from the electrode to thereby improve the current multiplication effect.

In the light-emitting device in this invention, light emitted from the organic EL layer is contained in a sensitive wavelength range of the photoconductor.

In the light-emitting device, light emitted from the organic EL layer is contained in the sensitive wavelength range of the photoconductor. Hence, carriers are generated in the photoconductor by feedback light from the organic EL layer.

In the light-emitting in this invention, the external light-emitting part is made of organic EL layer having a simple matrix structure.

In the light-emitting device, when the external light-emitting part emits light in any matrix intersection position of the simple matrix structure, a region of the photoconductor corresponding to the light-emitting position is irradiated with light to thereby generate carriers. Hence, the same region of the display light-emitting part can be displayed by simple matrix driving.

In the light-emitting in this invention, row selection scanning light is emitted from the external light-emitting part; and an image signal is supplied to column electrodes of the organic EL layer.

In the light-emitting device, when row selection scanning light is emitted from the external light-emitting part, carriers are generated in the row direction of the photoconductor. On the other hand, an image signal is supplied to a corresponding column electrode of the organic EL layer. Hence, the organic EL layer emits light at a point of intersection between the row irradiated with the row selection scanning light and the column to which the image signal is applied.

In the light-emitting in this invention, a row selection scanning signal is supplied to row electrodes of the display light-emitting part; and image signal light for column selection is emitted from the external light-emitting part.

In the light-emitting device, when column selection image signal light is emitted from the external light-emitting part, carriers are generated in the column direction of the photoconductor in accordance with the image signal. On the other hand, a row selection scanning signal is supplied to a corresponding row electrode of the organic EL layer. Hence, the organic EL layer emits light at a point of intersection between the column to which the column selection image signal is applied and the row irradiated with the row selection scanning signal light.

In the light-emitting in this invention, the organic EL layer is made of a high-molecular material.

In the light-emitting device, a high-molecular compound made from a polymer can be used as the organic EL layer.

In the light-emitting in this invention, the organic EL layer is made of a low-molecular material.

In the light-emitting device, a low-molecular compound can be used as the organic EL layer.

In the light-emitting device in this invention, the organic EL layer is of a single layer type.

In the light-emitting device, a homogenous light emission color can be obtained in an easy production process.

In the light-emitting device in this invention, the organic EL layer is of a laminate layer type.

In the light-emitting device, light-emitting layers with different colors can be laminated on each other. When the light-emitting layers are driven independently, light with different mixture colors can be emitted in a predetermined region.

In the light-emitting in this invention, a resistance layer is provided between voltage-applied electrodes.

In the light-emitting device, a high intensity of electric field necessary for EL light emission can be applied to the organic EL layer stably without causing any insulation breakdown between the first and second electrodes. The electric field can be controlled so that a constant current flows in the organic EL layer. Moreover, the organic EL layer can be insulated from the atmosphere to thereby improve stability.

According to a further aspect of the present invention, there is provided an exposure device comprising a light-emitting device, the light-emitting device being used for exposing a photosensitive material to light.

In the exposure device, the light-emitting device is driven on the basis of image information. Hence, a photosensitive material can be exposed to light emitted from the light-emitting device. Moreover, digital multiple exposure can be made, so that high-speed recording can be made.

According to another aspect of the present invention, there is provided a flat display device comprising a light-emitting device, the light-emitting device being used for displaying any optional image.

In the flat display device, the light-emitting device is driven on the basis of image information. Hence, light emission of the organic EL layer can be controlled by writing with low energy. Light emission of the display light-emitting part can be continued stably by carriers multiplied to be not smaller than the light carriers generated by light emission of the display light-emitting part per se. Two-dimensional light emission display attained by memory characteristic can be made in the same level as the case where TFT is used.

DESCRIPTION OF THE PREFERRED EMBODIMENTS

Preferable embodiments of the present invention, as to a light-emitting device and an exposure device and a display device which use the light-emitting device, will be described below in detail with reference to the drawings.

Figure 1:
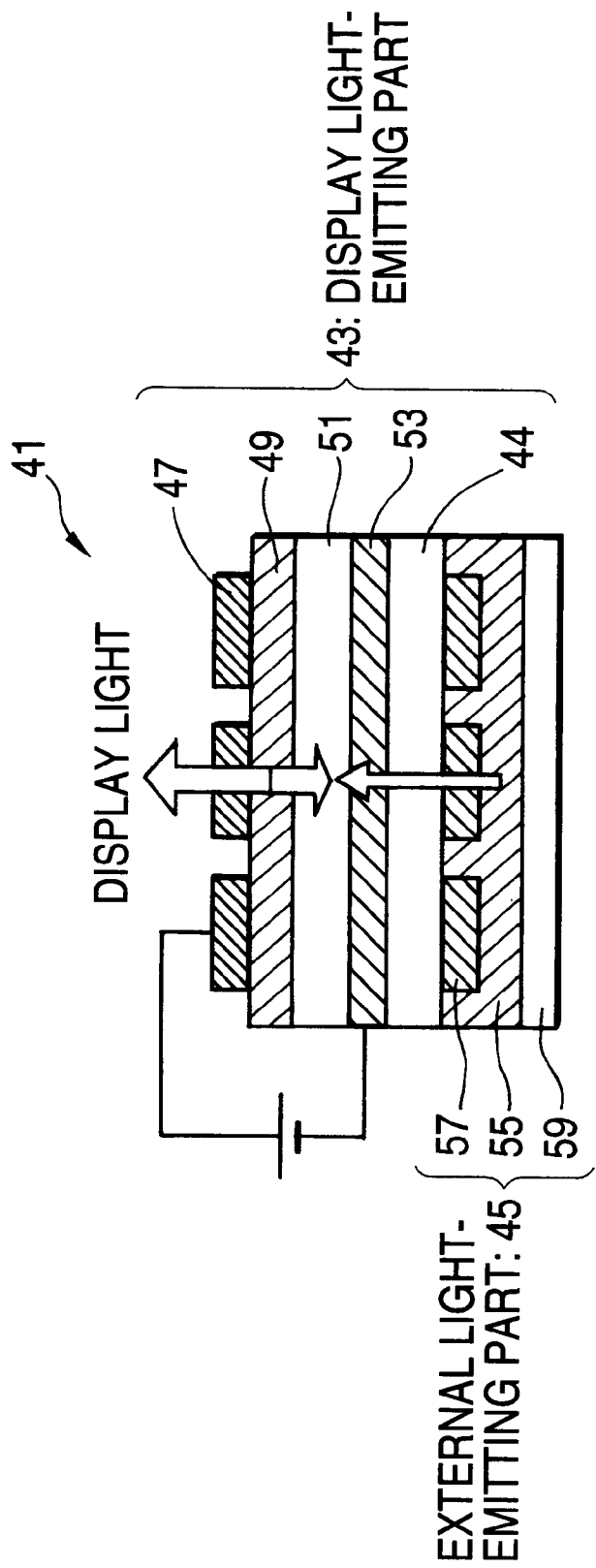
FIG. 1 is a sectional view showing a first embodiment of a light-emitting device according to the present invention.

FIG. 1 is a sectional view showing a first embodiment of the light-emitting device according to the present invention.

The light-emitting device 41 generally comprises a display light-emitting part 43, and an external light-emitting part 45. The external light-emitting part 45 is laminated onto the display light-emitting part 43 through an electrically insulating layer 44. The display light-emitting part 43 is made of a laminate of a first electrode (front electrode) 47, an organic EL layer 49, a photoconductive layer 51 and a second electrode (rear electrode) 53 in sequence. The front electrode 47 functions as an anode and the rear electrode 53 functions as a cathode. In this case, the front electrode 47 is preferably made of a transparent electrode material which has a high work function for injecting holes and which efficiently transmits light emitted from the organic EL layer 49. Specifically, ITO is preferable. Besides ITO, a super-thin-film metal (10 nm to 20 nm) having a high work function and having transparency is preferable. The rear electrode 53 is preferably made of a super-thin-film metal (10 nm to 20 nm) which has a work function to form a Schottky junction to the photoconductive layer 51 and which has transparency for transmitting light emitted from the external light-emitting part 45. In this case, gold is preferable. To improve the electrically conducting characteristic of the rear electrode 53, a transparent electrode of ITO or the like may be laminated onto the outer side of the super-thin-film metal.

The external light-emitting part 45 is constituted by an EL layer 55, a plurality of electrodes 57 formed on one surface of the EL layer 55 so as to be parallel to each other, and a plurality of electrodes 59 formed on the other surface of the EL layer 55 so as to be parallel to each other and perpendicular to the electrodes 57. The EL layer 55 may be made of an organic EL in the same manner as in the organic EL layer 49.

The photoconductive layer 51 is made of a photoconductor which is an inorganic semiconductor such as c-Si, a-Se, a-SiC, or the like. The photoconductive layer 51 generates rapid current multiplication phenomena. An avalanche effect which will be described later is one of the multiplication phenomena. Incidentally, the photoconductive layer 51 may be made of an organic photoconductor. In this case, all current multiplication phenomena (injection of light-induced electron) generated in an inorganic silicon semiconductor or the like can be obtained except the avalanche effect. Examples of the organic photoconductor may include a perylene pigment, a quinacridone pigment, a naphthalenetetracarboxylic derivative, etc.

The electrodes 57 of the external light-emitting part 45 are connected to column electrodes and the electrodes 59 thereof are connected to row electrodes. When a voltage is applied between these column and row electrodes, signal light is emitted from the interface-side surface of the photoconductive layer 51. That is, the external light-emitting part 45 is configured so as to be driven in the form of a simple matrix. The external light-emitting part 45 driven in the form of a simple matrix can emit light from any region on a plane. The emitted light is received by the photoconductive layer 51 opposite to the external light-emitting part 45. For example, the light emitted from the external light-emitting part 45 is ultraviolet light and contained in a sensitive wavelength range of the photoconductive layer 51.

The organic EL layer 49 is functionally made of a material having an electron transporting function, a hole transporting function, a light-emitting function, a carrier injection accelerating function, etc. The organic EL layer 49 may be of a single layer type or of a laminate layer type. Specifically, a high-molecular material is chiefly preferable when the organic EL layer 49 is of the single layer type. Examples of the preferable high-molecular material are disjucate high-molecular materials such as PPV (polyphenylene-vinylene) derivatives, and conjugate high-molecular materials such as PVK (polyvinyl carbazole). A low-molecular material is chiefly preferable when the organic EL layer 49 is of the laminate layer type. A material having an electron transporting function and a material having a hole transporting function are laminated on each other to thereby form the organic EL layer 49. A material having a light-emitting function may be interposed between the electron transporting function material and the hole transporting function material if necessary. Specifically, an organic chelate complex material such as Alq3 (8-quinolinol aluminum) is preferably used as the electron transporting function material or as the light-emitting function material. An organic material such as TPD (tetraphenyldiaminodiphenyl) is preferably used as the hole transporting function material. A pigment or coloring material such as a coumarin derivative, a rubren derivative or a perylene derivative is preferably used as a dopant material having a light-emitting function.

The operation of the light-emitting device 41 configured as described above will be described below.

When the external light-emitting part 45 is in an off state, the photoconductive layer 51 exhibits high resistance. Even in the case where a voltage for making the organic EL layer 49 be in a light emission state is applied between the front electrode 47 and the rear electrode 53, the voltage is divided at the impedance ratio between the organic EL layer 49 and the photoconductive layer 51, so that the organic EL layer 49 cannot emit light.

On the other hand, when a voltage is applied between electrodes 57 and 59 in the external light-emitting part 45, a predetermined region of the EL layer 55 in the external light-emitting part 45 emits light. When the emitted light is received by the photoconductive layer 51, the photoconductive layer 51 gets into a low resistance state. Thus, an electric field which is not smaller than a threshold for light emission is applied to the organic EL layer 49.

Figure 2:
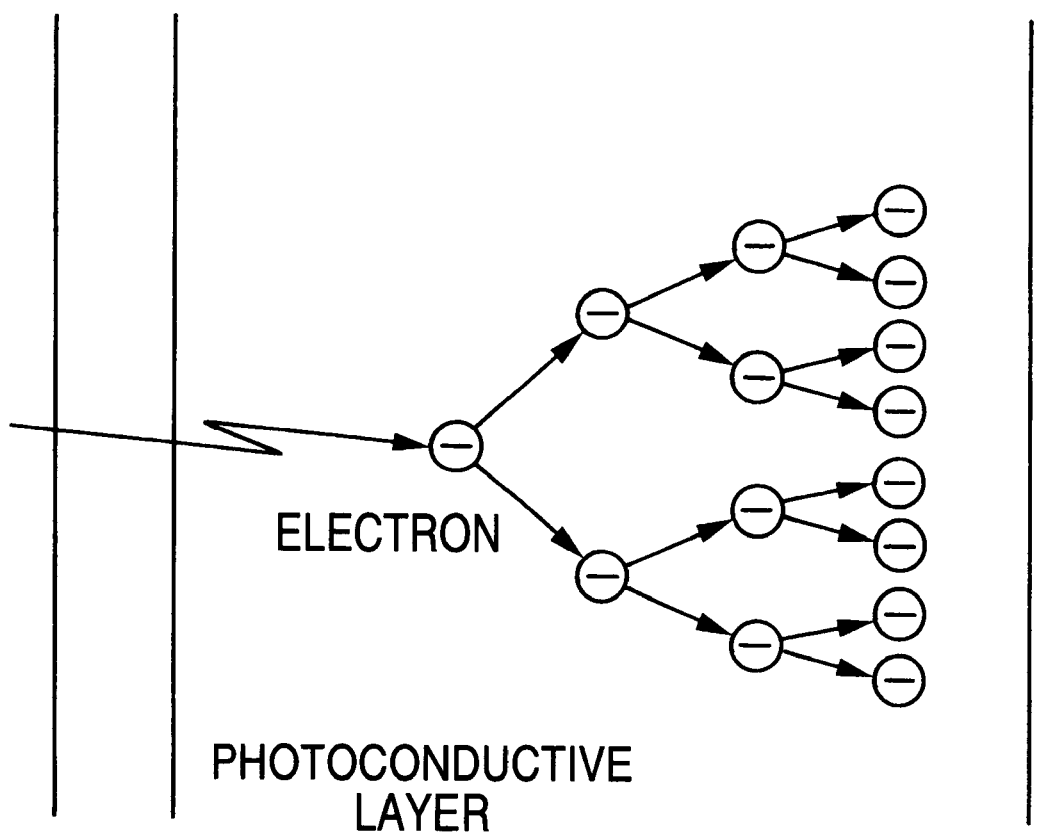
FIG. 2 is an explanatory view showing an avalanche effect in the first embodiment.

That is, as shown in FIG. 2, a carrier collides with a grating atom to ionize bound electrons to thereby generate free electrons and holes as secondary carriers. These secondary carriers take part in collision ionization successively, so that the carriers are multiplied acceleratively. As a result, a cumulative ionization phenomenon, that is, an avalanche effect causing rapid multiplication of a current, occurs in the photoconductive layer 51. Hence, when the external light-emitting part 45 emits light, a carrier is generated in a region of the photoconductive layer 51 on which light is incident. A portion of the organic EL layer 49 corresponding to the carrier-generated region of the photoconductive layer 51 emits light. On this occasion, the carrier generated in the photoelectric conversion process is multiplied by the current amplification mechanism owing to the avalanche effect. Thus, the carrier generating efficiency exceeds 1, so that high luminance is obtained.

As described above, in accordance with the aforementioned light-emitting device 41, the quantum efficiency of carriers generated in the photoconductive layer 51 relative to the quantity of incident light from the external light-emitting part 45 exceeds 1. Hence, light emission of the organic EL layer 49 with high energy can be controlled by write emission owing to the external light-emitting part 45 with low energy. Therefore, when write light is generated by the external light-emitting part 45, the light may have low energy. That is, the external light-emitting part 45 can be driven by a low current.

Hence, for example, even in the case where write light is emitted from the external light-emitting part 45 to any place, the voltage drop across the electrode wiring of the external light-emitting part 45 is reduced because the external light-emitting part 45 is of a simple matrix drive type. Furthermore, even in the case where a high current flows in the display light-emitting part 43, there is no voltage drop on the electrodes and no crosstalk is generated between pixels because the front electrode 47 and the rear electrode 53 need not be driven in the form of a matrix. Hence, switching devices such as TFT need not be used, so that an inexpensive large-area high-luminance organic EL device can be produced.

A second embodiment of the light-emitting device according to the present invention will be described below.

The light-emitting device according to this embodiment has substantially the same configuration as the light-emitting device 41 according to the first embodiment except the photoconductor for forming the photoconductive layer 51.

Figure 3:
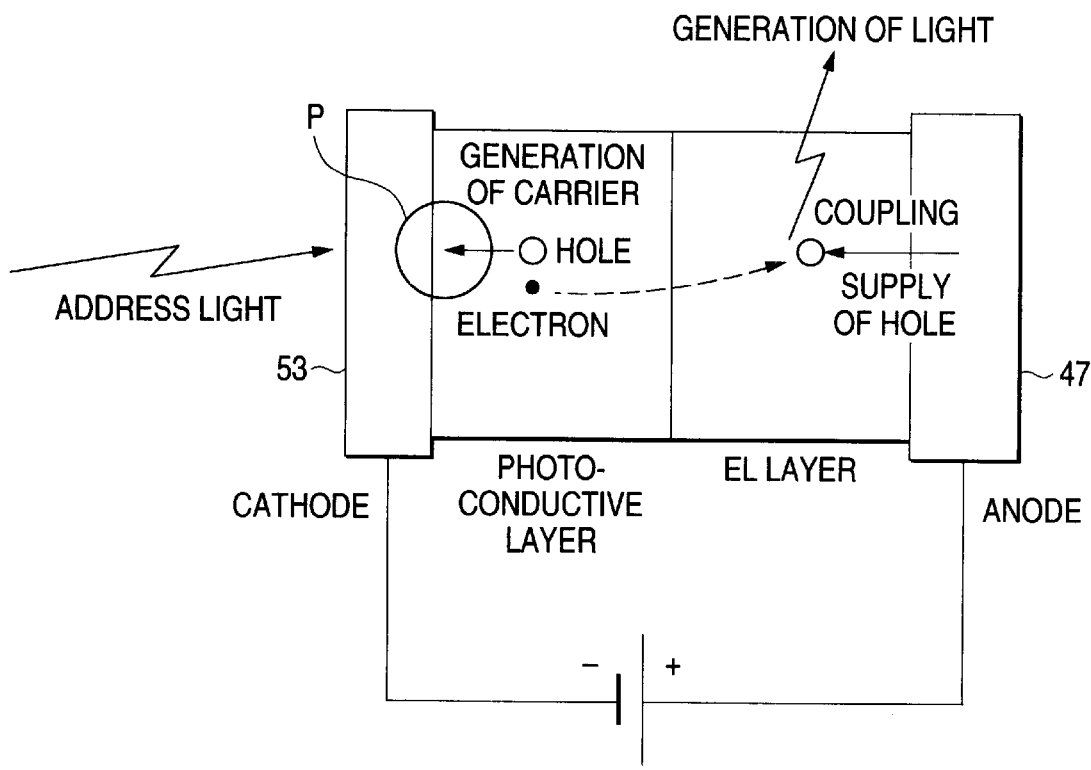
FIGS. 3A and 3B are typical views for explaining a current amplification mechanism in a light-emitting device according to a second embodiment of the present invention.
Figure 3:
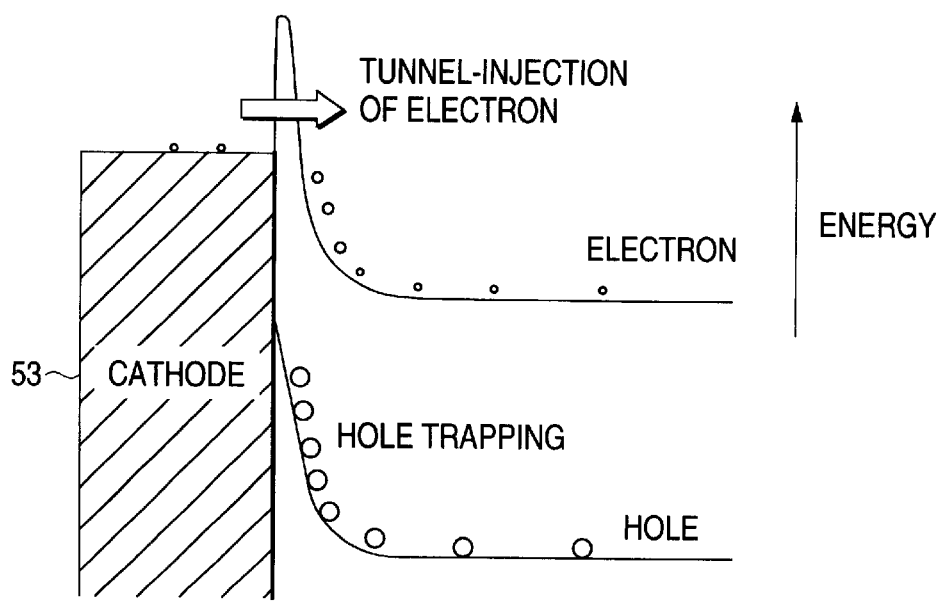

A perylene pigment is used as the material of the photoconductor in the light-emitting device according to the present invention. The photoconductor in the light-emitting device operates as follows. As shown in FIG. 3A which is an partly enlarged view of the light-emitting device, when the photoconductive layer 51 is irradiated with address light, carriers (electrons and holes) photogenerated in the irradiation region move along the electric field. The holes are partially trapped and accumulated in a neighbor of the interface between the photoconductive layer 51 and the electrode surface. As a result, a large intensity of electric field is concentrated in a depletion layer. Finally, as shown in FIG. 3B which shows an energy structure in the portion P in FIG. 3A, a large amount of electrons are injected from the rear electrode 53 into the photoconductive layer 51 and multiplied. On this occasion, it is known that the quantity of current which has already flown before rising of multiplied current is constant regardless of light intensity.

It is conceived that this is because a constant quantity of electric charges are accumulated in the neighbor of the interface between the rear electrode 53 and the photoconductive layer 51 to thereby cause the multiplication phenomenon. Hence, it may be the that the multiplication phenomenon in the photoconductor is different from the aforementioned avalanche effect and is generated by a light-induced electron injection effect in which light-induced electrons generated in the interface between the rear electrode 53 and the photoconductive layer 51 are tunneled and injected. The barrier and carrier trap in the interface between the rear electrode 53 and the photoconductive layer 51 is an important factor to this multiplication phenomenon. The surface of the pigment such as a perylene pigment is formed from delicate concaves and convexes. A plurality of concave portions through which holes cannot pass are present in the interface. In the present invention, it is proved that such a surface structure controls the multiplication phenomenon.

Incidentally, in this embodiment, the perylene pigment may be replaced by a quinacridone pigment, a naphthalenetetracarboxylic derivative, or the like.

In the light-emitting device according to this embodiment, when holes are generated in the photoconductive layer 51 by light absorption, a great deal of electrons are injected from the rear electrode 53 into the photoconductive layer 51 by the current amplification mechanism of the photoconductor owing to light-induced electron injection. The injected electrons are coupled with the holes injected from the front electrode 47 opposite to the rear electrode 53. On this occasion, the injection of carriers forms a tunnel current in the interface between the photoconductive layer 51 and the rear electrode 53. Hence, carriers not having sufficient energy to skip over the potential barrier can pass through the potential barrier because the barrier is thin. Hence, a current flows in the interface between the photoconductive layer 51 and the rear electrode 53.

In this light-emitting device, the quantum efficiency of carriers generated in the photoconductive layer 51 relative to the quantity of incident light from the external light-emitting part 45 exceeds 1. Hence, light emission of the organic EL layer 49 with high energy can be controlled by write emission owing to the external light-emitting part 45 with low energy. Therefore, when write light is generated by the external light-emitting part 45, the light may have low energy. That is, the external light-emitting part 45 can be driven by a low current.

Hence, even in the case where write light is emitted from the external light-emitting part 45 to any place of the photoconductive layer 51, the voltage drop in electrode wiring of the external light-emitting part 45 is reduced because the external light-emitting part 45 is of a simple matrix drive type. Furthermore, even in the case where a high current flows in the display light-emitting part 43, there is no voltage drop on the electrodes and no crosstalk is generated between pixels because the front electrode 47 and the rear electrode 53 need not be driven in the form of a matrix. Hence, switching devices such as TFT need not be used, so that an inexpensive large-area high-luminance organic EL device can be produced.

A third embodiment of the light-emitting device according to the present invention will be described below.

The light-emitting device according to this embodiment has substantially the same configuration as the light-emitting device 41 according to the first embodiment except the photoconductor for forming the photoconductive layer 51.

Figure 4:
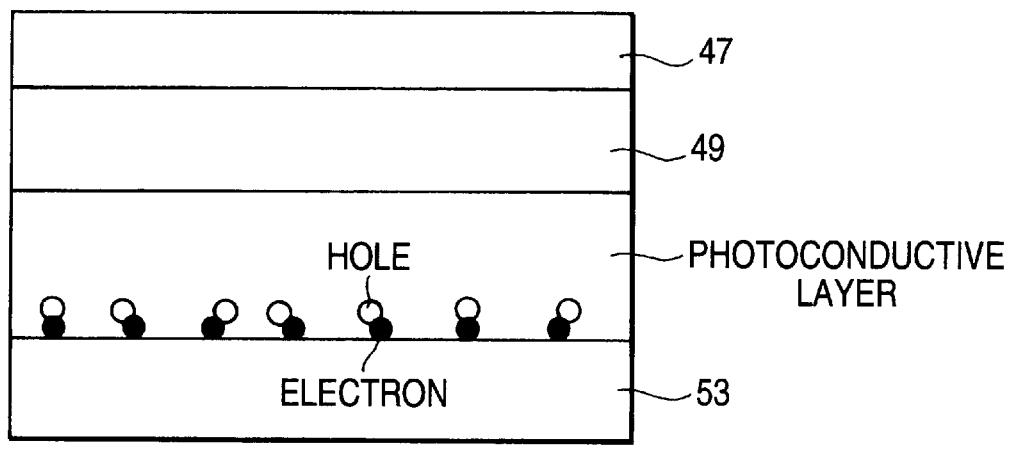
FIG. 4 is a typical view at an equilibrium time for explaining a current amplification mechanism in a light-emitting device according to a third embodiment of the present invention.
Figure 5:
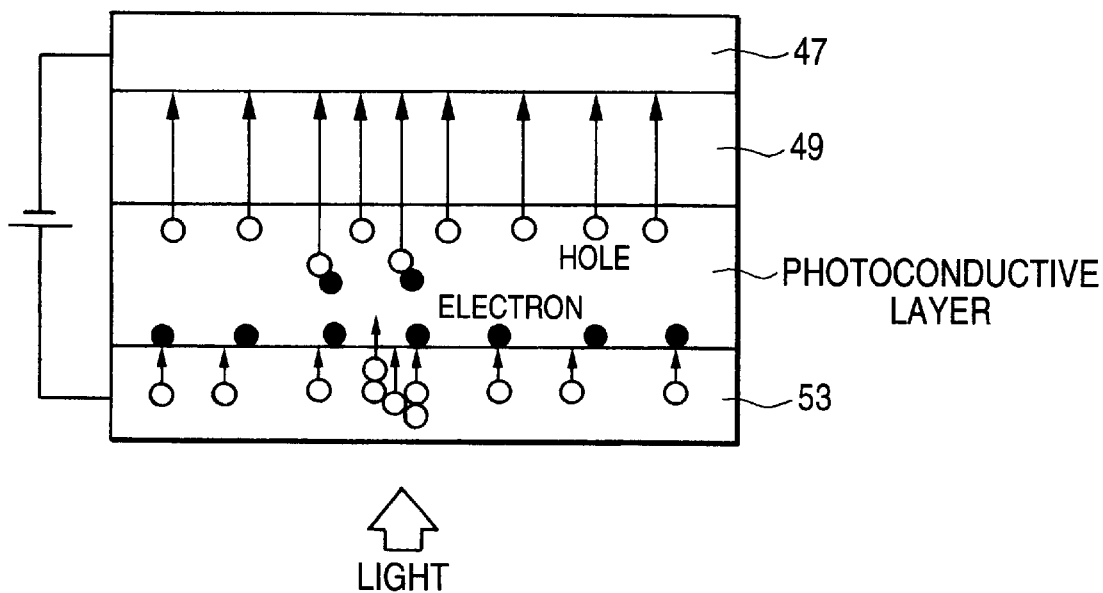
FIG. 5 is a typical view at a voltage applying time for explaining the current amplification mechanism in the light-emitting device according to the third embodiment of the present invention.

A bis-azo pigment is used as the material of the photoconductor in the light-emitting device according to the present invention. An ITO film is used as the rear electrode 53. The light-emitting device operates as follows. As shown in FIG. 4, carriers thermally generated at room temperature are trapped in the electron trap in a neighbor of the interface between the rear electrode 53 and the photoconductive layer 51. As a result, a thermal equilibrium state is achieved. When a voltage is applied between the front electrode 47 and the rear electrode 53 in this state, holes of carriers in a non-irradiation portion of the photoconductive layer 51 move to the front electrode 47 side, but electrons of carriers are trapped in the interface between the rear electrode 53 and the photoconductive layer 51, as shown in FIG. 5.

In the interface between the rear electrode 53 and the photoconductive layer 51, the trapped electrons reduce the barrier to injection of holes injected from the rear electrode 53 side into the photoconductive layer 51 to thereby promote injection of holes.

On the other hand, carriers are generated in the irradiation portion. Holes move to the front electrode 47 side and electrons are trapped in the interface between the rear electrode 53 and the photoconductive layer 51 in the same manner as described above. In the irradiation portion, the electron density of the interface between the rear electrode 53 and the photoconductive layer 51 increases compared with that in the non-irradiation portion. Hence, the carriers skip over the potential barrier, so that the carriers are injected. Moreover, in the irradiation portion, injection of holes from the rear electrode 53 side increases, so that a multiplication phenomenon is caused by the injection of holes.

In this light-emitting device, the quantum efficiency of carriers generated in the photoconductive layer 51 relative to the quantity of incident light from the external light-emitting part 45 exceeds 1. Hence, light emission of the organic EL layer 49 with high energy can be controlled by write emission owing to the external light-emitting part 45 with low energy. Therefore, when write light is generated by the external light-emitting part 45, the light may have low energy. That is, the external light-emitting part 45 can be driven by a low current.

Hence, even in the case where write light is emitted from the external light-emitting part 45 to any place of the photoconductive layer 51, the voltage drop in electrode wiring of the external light-emitting part 45 is reduced because the external light-emitting part 45 is of a simple matrix drive type. Furthermore, even in the case where a high current flows in the display light-emitting part 43, there is no voltage drop on the electrodes and no crosstalk is generated between pixels because the front electrode 47 and the rear electrode 53 need not be driven in the form of a matrix. Hence, switching devices such as TFT need not be used, so that an inexpensive large-area high-luminance organic EL device can be produced.

Moreover, in this light-emitting device, resistance layers are provided between the front electrode 47 and the photoconductive layer 51 and between the rear electrode 53 and the photoconductive layer 51 respectively. Hence, when a voltage is applied between the front electrode 47 and the rear electrode 53, the resistance layers act so that a constant current flows. Hence, stabler light emission can be made.

Although the configurations described in the first, second and third embodiments have shown the case where the means for writing into the display light-emitting part 43 is based on write owing to the simple matrix drive of the external light-emitting part 45, other write means may be used.

At least one of the two electrodes in the external light-emitting part 45 is formed as a plurality of stripe electrodes. The stripe electrodes are used as row selection electrodes respectively. At least one of the rear and front electrodes 53 and 47 in the display light-emitting part 43 is formed as a plurality of stripe electrodes perpendicular to the row selection electrodes. The stripe electrodes are used as column electrodes. Now, the row selection electrodes are driven linearly sequentially and row selection scanning light is emitted to the photoconductive layer 51. In synchronism with this operation, a signal voltage (or current) corresponding to the image is applied to the column electrodes. When the row selection scanning light is emitted and a signal voltage (or current) is applied from the column electrodes, the organic EL corresponding to the pixel emits light. Hence, two-dimensional light emission display can be made at option.

Another example is as follows. At least one of the two electrodes in the external light-emitting part 45 is provided as a plurality of stripe electrodes and the stripe electrodes are used as column electrodes respectively. Further, at least one of the rear and front electrodes 53 and 47 in the display light-emitting part 43 is provided as a plurality of stripe electrodes perpendicular to the column electrodes. The stripe electrodes are used as row selection electrodes. Now, the row selection electrodes are driven linearly sequentially and a voltage (or current) is applied between the rear electrode 53 and the front electrode 47 linearly sequentially. In synchronism with this operation, the column electrodes of the external light-emitting part 45 are driven so that write light corresponding to the image is emitted to the photoconductor layer 51. When a row scanning voltage (or current) is applied between the rear electrode 53 and the front electrode 47 and write light corresponding to the image is emitted, the organic EL of the pixel emits light. Hence, two-dimensional light emission display can be made.

Although the aforementioned embodiment has shown the case where the electrically insulating layer 44 is provided between the external light-emitting part 45 and the display light-emitting part 43, the electrically insulating layer 44 may be omitted if the photoconductive layer 51 side electrode of the external light-emitting part 45 is provided as a common electrode to the rear electrode 53 of the display light-emitting part 43. In this case, the device configuration is simplified.

Any other device configuration may be used so long as it accords with the gist of the present invention.

A fourth embodiment of the light-emitting device according to the present invention will be described below.

The light-emitting device according to this embodiment has memory characteristic in addition to the current multiplication phenomenon described in the respective aforementioned embodiments. Incidentally, the basic configuration of the light-emitting device according to this embodiment will be described with reference to FIG. 1 because the light-emitting device has substantially the same configuration as that of the light-emitting device 41 according to the first embodiment.

When the external light-emitting part 45 is in an off state, the photoconductive layer 51 in the light-emitting device configured as described above exhibits high resistance. Even in the case where a voltage to make the organic EL layer 49 in a light emission state is applied between the front electrode 47 and the rear electrode 53, the voltage is divided at the impedance ratio between the organic EL layer 49 and the photoconductive layer so that the organic EL layer 49 cannot emit light.

When a voltage is applied between electrodes 57 and 59 in the external light-emitting part 45, a predetermined region of the EL layer 55 in the external light-emitting part 45 emits light. When the emitted light is emitted to the photoconductive layer 51, the photoconductive layer 51 gets into a low resistance state. Thus, an electric field which is not smaller than a threshold for light emission is applied to the organic EL layer 49.

That is, a carrier collides with a grating atom to ionize bound electrons to thereby generate free electrons and holes as secondary carriers. These secondary carriers take part in collision ionization successively, so that the carriers are multiplied acceleratively. As a result, a cumulative ionization phenomenon, that is, an avalanche effect causing rapid multiplication of a current, occurs in the photoconductive layer 51. Thus, the carrier generating efficiency exceeds 1, so that high luminance is obtained.

Moreover, light from the display light-emitting part 43 is emitted to the outside and to the photoconductive layer 51. When the feedback emitted light is absorbed to the photoconductive layer 51 again, a great deal of carriers are generated by the aforementioned multiplication effect. Hence, the photoconductive layer 51 is excited by light emitted from the organic EL layer 49, so that the photoconductive layer 51 is kept in the low resistance state. Hence, even in the case where incident light from the external light-emitting part 45 is turned off, carriers are continuously generated by the feedback light effect. There is therefore provided memory characteristic in which emitted light from the display light-emitting part 43 is continuously emitted until the voltage is turned off.

Figure 6:
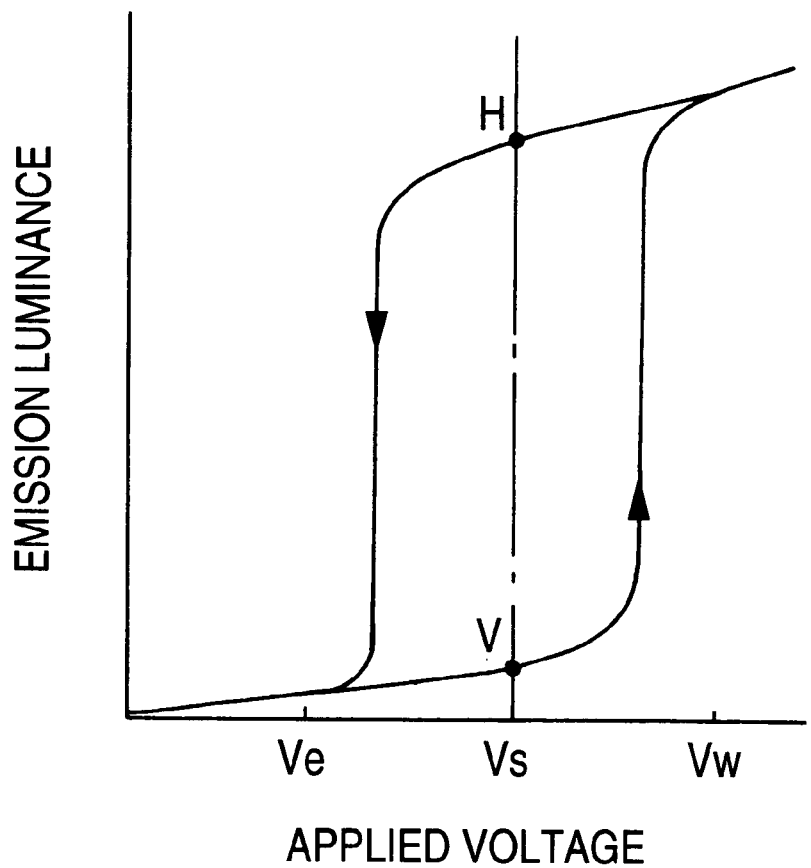
FIG. 6 is an explanatory view of the hysteresis characteristic of a light-emitting device according to a fourth embodiment of the present invention.

In this case, hysteresis shown in FIG. 6 appears between voltage and light-emitting characteristic. The hysteresis has two states of bright (on) and dark (off) to the generated carriers. In the applied voltage Vs owing to the initially generated carriers, the hysteresis is in a dark (L) state. When the applied voltage reaches Vw, the state moves in the direction of the arrow on the hystresis curve and gets into a high luminance state. When the applied voltage goes back to Vs, the light-emitting device is made stable in a bright (H) state. When the applied voltage is reduced to Ve, the state moves down in the direction of the arrow on the hysteresis curve and finally goes back to the dark (L) state.

A specific example of a flat display device of two-dimensional arrangement will be described now. At least one of the two electrodes in the external light-emitting part 45 is provided as a plurality of stripe electrodes and the stripe electrodes are used as column electrodes. Further, at least one of the rear ad front electrodes 53 and 47 in the display light-emitting part 43 is provided as a plurality of stripe electrodes perpendicular to the column electrodes. The stripe electrodes are used as row selection electrodes. Now, the row selection electrodes are driven linearly sequentially and a voltage (or current) is applied between the rear electrode 53 and the front electrode 47 linearly sequentially. In synchronism with this operation, the column electrodes in the external light-emitting part 45 are driven so that write light corresponding to the image is emitted to the photoconductive layer 51. When a row scanning voltage (or current) is applied between the rear electrode 53 and the front electrode 47 and write light corresponding to the image is emitted, the organic EL of the pixel emits light. This light emission can be kept.

Figure 7:
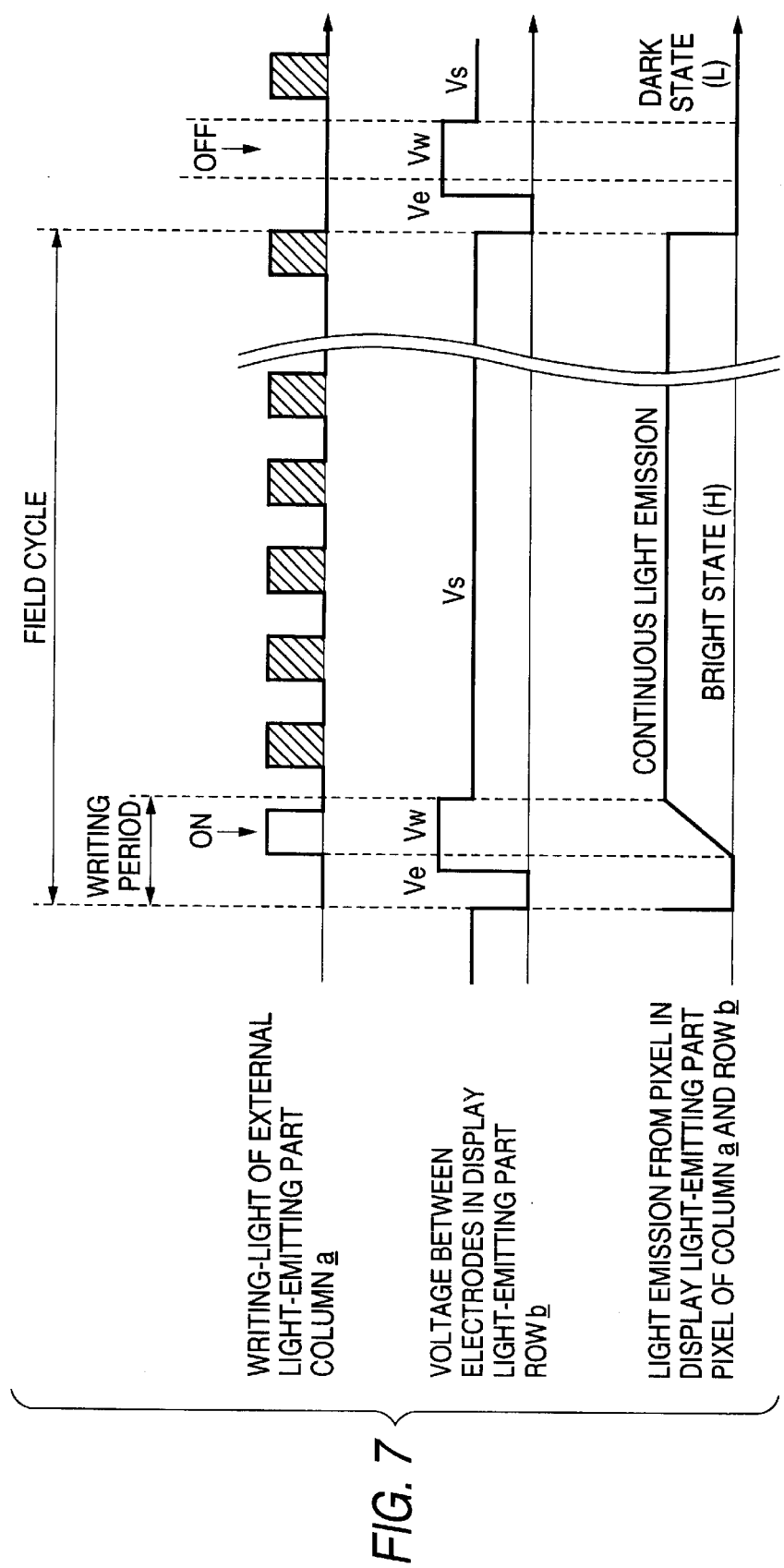
FIG. 7 is an explanatory view of the light-emitting operation of the light-emitting device according to the fourth embodiment.
Figure 8:
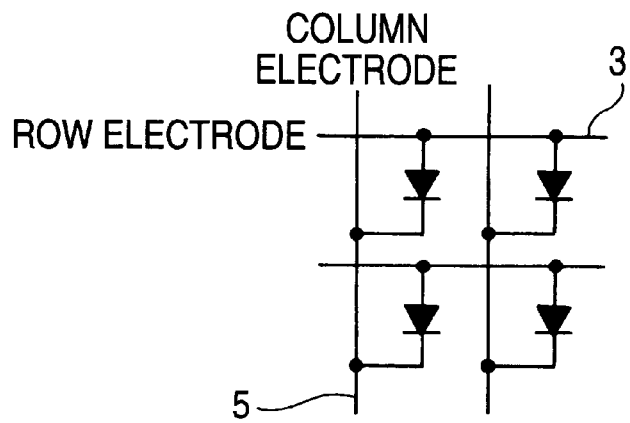
FIG. 8 is a diagram of a circuit equivalent to a background-art organic EL light-emitting device formed as a simple matrix structure.
Figure 9:
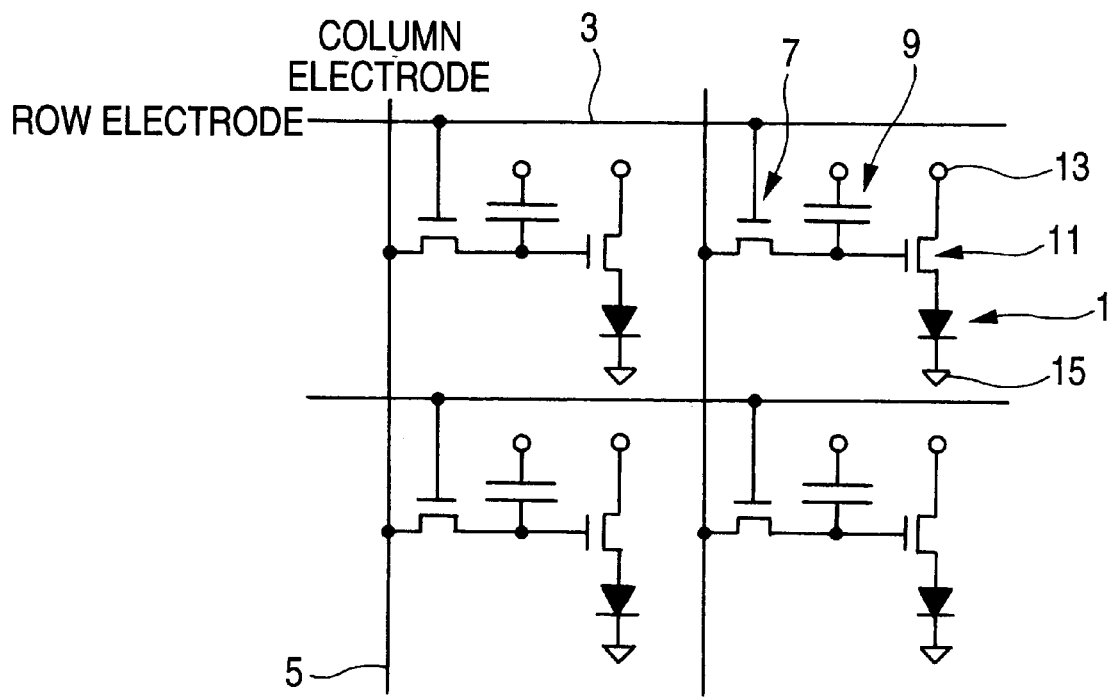
FIG. 9 is a diagram of a circuit equivalent to a background-art organic EL light-emitting device having TFT.
Figure 10:
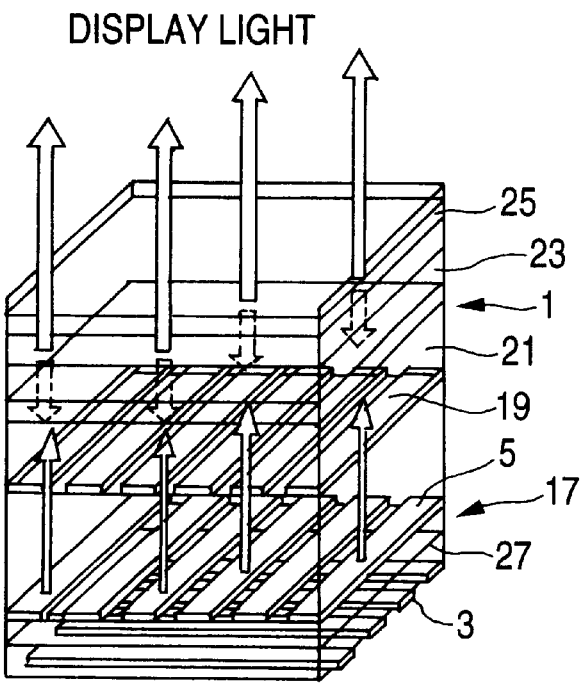
FIG. 10 is a configuration view of a background-art organic EL light-emitting device having a photoconductive layer.
Figure 11:
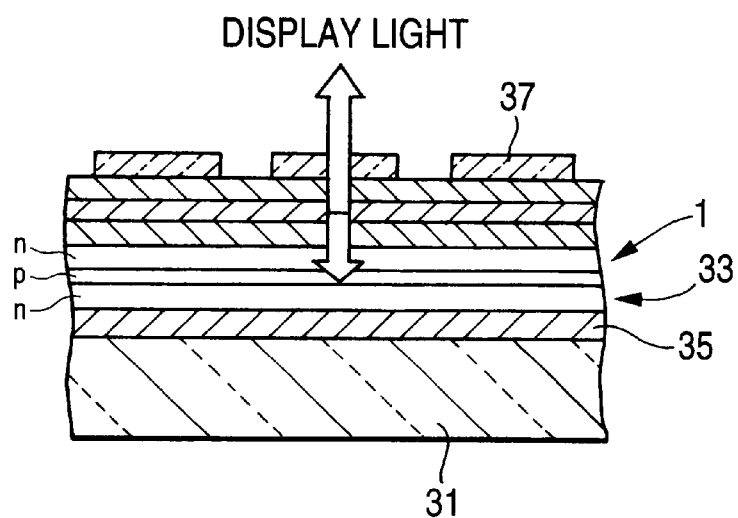
FIG. 11 is a configuration view of a background-art organic EL light-emitting device having an optical switching device.

A specific light-emitting operation will be described below in connection with these configurations with reference to FIG. 7 provided as a timing chart.

As shown in FIG. 7, the light-emitting operation is made as follows. Writing is performed in row sequence in each field cycle. Writing is performed in a write period. First, a voltage Ve is applied between electrodes corresponding to the selected row (row b) of the display light-emitting part 43 to turn (reset) the row to a dark state (L) as a whole. Then, a voltage Vw is applied. Then, write light is controlled in accordance with the image by the external light-emitting part 45 which can emit light column by column. When the column a is turned on (subjected to light emission) in FIG. 7, the pixel (column a, row b) in the display light-emitting part 43 emits light and gets into a bright state (H). Once light emission is made, the light emission is continued even in the case where write light is turned off. On the contrary, when the column a in the external light-emitting part 45 is turned off in a write period (so as not to be subjected to light emission), the image (column a, row b) in the display light-emitting part 43 gets into a dark state (L). After the write period, the voltage between electrodes corresponding to the selected row (b) in the display light-emitting part 43 is changed to Vs. On this occasion, the state of the row b in the display light-emitting part 43 is kept regardless of the write light on the column a in the external light-emitting part 45.

According to this embodiment, the quantum efficiency of carriers generated in the photoconductive layer 51 relative to the quantity of incident light from the external light-emitting part 45 and relative to the quantity of incident light owing to the self light emission of the display light-emitting part 43 exceeds 1. Hence, light emission of the organic EL layer 49 with high energy can be controlled by write emission owing to the external light-emitting part 45 with low energy. Moreover, the display light-emitting part 43 can be made to emit light stably and continuously by carriers which are multiplied so as to be not smaller than the light carriers generated by self light emission of the display light-emitting part 43. Hence, there can be made two-dimensional light emission display with memory characteristic as in the case where TFT is used. As a result, light emission high in peak light intensity, though required in the background-art simple matrix organic EL, is not required in this embodiment, so that there is no voltage drop on the electrode wiring because of a large current and no crosstalk is generated between pixels. In addition, switching devices such as TFT which becomes expensive with the increase of size is not required. Hence, an inexpensive large-area high-definition high-luminance organic EL device can be provided.

Another embodiment of the flat display device of two-dimensional arrangement will be described below.

At least one of the two electrodes in the external light-emitting part 45 is formed as a plurality of stripe electrodes and the stripe electrodes are used as row selection electrodes respectively. At least one of the rear and front electrodes 53 and 47 in the display light-emitting part 43 is formed as a plurality of stripe electrodes perpendicular to the row selection electrodes. The stripe electrodes are used as column electrodes. Now, the row selection electrodes are driven linearly sequentially and row selection scanning light is emitted to the photoconductive layer 51. In synchronism with this operation, a signal voltage (or current) corresponding to the image is applied to the column electrodes. When the row selection scanning light is emitted and a sufficient signal voltage (or current) is applied from the column electrodes, the organic EL of the pixel emits light. After the selection scanning, the light emission state is kept. Hence, two-dimensional light emission display can be made at option.

A further embodiment is as follows. The external light-emitting part 45 is provided as a simple matrix structure so that any pixel can be written by the simple matrix drive of the external light-emitting part 45. At the same time, at least one of the rear and front electrodes 53 and 47 in the display light-emitting part 43 is provided as a plurality of stripe electrodes and the stripe electrodes are used as row selection electrodes. Now, the row selection electrodes are scanned selectively. Once the selected display light-emitting part 43 is reset, a sufficient voltage (or current) is applied between the rear and front electrodes 53 and 47 in the display light-emitting part 43. At the same time, the row of the external light-emitting part 45 corresponding to the selected row is subjected to light emission in accordance with the image. Write light is emitted to the photoconductive layer 51 so that the selected row in the display light-emitting part 43 is made to emit light. After selection scanning, the write light is not supplied so that the emission state is kept. Hence, two-dimensional light emission display can be made at option.

Although the aforementioned embodiment has shown the case where the electrically insulating layer 44 is provided between the external light-emitting part 45 and the display light-emitting part 43, the electrically insulating layer 44 may be omitted if the photoconductive layer 51 side electrode of the external light-emitting part 45 is provided as a common electrode to the rear electrode 53 of the display light-emitting part 43. In this manner, the device configuration is simplified.

Further, the light-emitting device in each of the aforementioned embodiments can be used as an exposure device so that a photosensitive material or the like can be exposed to light by the exposure device. When the light-emitting device is used as an exposure device, digital multiple exposure can be made. Hence, high-speed recording (printing) can be made particularly when the light-emitting device as the exposure device is used in an image recording apparatus (such as a printer or a press machine) for forming an image through exposure.

Specifically, in a printer using the background-art exposure device, a predetermined area is exposed for a predetermined time. Hence, relative movement of the exposure device to an image generator body stops during the exposure. On the contrary, in a printer using the aforementioned light-emitting device as the exposure device, a light-emitting element corresponding to each of the matrix electrodes can be driven selectively so that digital multiple exposure can be made. Hence, line control can be made while the exposure device is moved relative to the image generator body. Hence, high-speed exposure can be made, so that recording speed can be improved greatly. Moreover, when digital multiple exposure is used effectively, this exposure device can be adapted to DDCP (digital direct color proof) provided by a combination of an electrophotographic technique and an offset printing technique and to CTP (computer-to-plate) in which an image is formed directly on a plate and transferred.

As described above in detail, the light-emitting device according to the present invention comprises a display light-emitting part, and an external light-emitting part. The display light-emitting part includes a photoconductive layer for receiving light emitted from the external light-emitting part, and the photoconductive layer is made of a photoconductor for multiplying generated carriers. By this arrangement, the quantum efficiency becomes larger than 1, so that high-grade light emission can be made. Hence, the display light emission state can be kept the same as that at the write time. Moreover, the photoconductive layer generates carriers continuously by light emitted from an organic EL layer. Hence, memory characteristic can be provided so that stable light emission can be made as in the case where TFT is used. Further, the burden imposed on the light-emitting device can be lightened by use of a simple matrix. In addition, a high-definition large-screen display can be provided inexpensively.

What is claimed is:

1. A light-emitting device comprising:
  a display light-emitting part made of a laminate of a first electrode, an organic EL layer, a photoconductive layer and a second electrode in sequence; and
  an external light-emitting part laminated on said second electrode side of said display light-emitting part, said photoconductive layer of said display light-emitting part receiving light emitted from said external light-emitting part, said photoconductive layer being made of a photoconductor having a current amplification mechanism so that carriers generated in a photoelectric conversion process are multiplied by said current amplification mechanism and continuously generated by light emitted from said organic EL layer;
  wherein said photoconductor has a current amplification mechanism attained by an avalanche effect.

2. A light-emitting device according to claim 1, wherein said photoconductor is one member selected from the group consisting of c-Si, a-Se and a-SiC.

3. A light-emitting device according to claim 1, wherein said photoconductor has a current amplification mechanism by which carriers (electrons or holes) are injected from said second electrode into said photoconductive layer on the basis of carriers (holes or electrons) generated in said photoconductive layer by light absorption.

4. A light-emitting device according to claim 3, wherein injection of said carriers exhibits a tunnel current in an interface between said photoconductive layer and said second electrode.

5. A light-emitting device according to claim 4, wherein each of said carriers to be injected is an electron.

6. A light-emitting device according to claim 4, wherein said photoconductive layer is made of an organic photoconductor.

7. A light-emitting device according to claim 6, wherein said organic photoconductor is one member selected from the group consisting of a perylene pigment, a quinacridone pigment, and a naphthalenetetracarboxylic derivative.

8. A light-emitting device according to claim 4, wherein said second electrode is an Au electrode.

9. A light-emitting device according to claim 3, wherein injection of said carriers is based on skipping over an electric potential barrier.

10. A light-emitting device according to claim 9, wherein each of said carriers to be injected is a hole.

11. A light-emitting device according to claim 9, wherein said photoconductive layer is made of an organic photoconductor.

12. A light-emitting device according to claim 11, wherein said organic photoconductor is a bis-azo pigment.

13. A light-emitting device according to claim 9, wherein said second electrode is made of an ITO film.

14. A light-emitting device according to claim 1, wherein light emitted from said organic EL layer is contained in a sensitive wavelength range of said photoconductor.

15. A light-emitting device according to claim 1 or 14, wherein said external light-emitting part is made of organic EL layer having a simple matrix structure.

16. A light-emitting device according to claim 1 or 14, wherein: row selection scanning light is emitted from said external light-emitting part; and an image signal is supplied to column electrodes of said organic EL layer.

17. A light-emitting device according to claim 1 or 14, wherein: a row selection scanning signal is supplied to row electrodes of said display light-emitting part; and image signal light for column selection is emitted from said external light-emitting part.

18. A light-emitting device according to claim 1 or 14, wherein said organic EL layer is made of a high-molecular material.

19. A light-emitting device according to claim 1 or 14, wherein said organic EL layer is made of a low-molecular material.

20. A light-emitting device according to claim 1 or 14, wherein said organic EL layer is of a single layer type.

21. A light-emitting device according to claim 1 or 14, wherein said organic EL layer is of a laminate layer type.

22. A light-emitting device according to claim 1 or 14, wherein a resistance layer is provided between voltage-applied electrodes.

23. An exposure device comprising a light-emitting device as defined in claim 1 or 14, said light-emitting device being used for exposing a photosensitive material to light.

24. A flat display device comprising a light-emitting device as defined in claim 1 or 14, said light-emitting device being used for displaying any optional image.

25. A light emitting device according to claim 1, wherein an interface between the photoconductive layer and the second electrode includes a plurality of concave portions through which holes cannot pass.

26. A light emitting device according to claim 1, wherein the photoconductor is not a bipolar phototransistor.

* * * * *